United States Patent
Cohen et al.

(10) Patent No.: US 8,399,314 B2
(45) Date of Patent: Mar. 19, 2013

(54) P-FET WITH A STRAINED NANOWIRE CHANNEL AND EMBEDDED SIGE SOURCE AND DRAIN STRESSORS

(75) Inventors: Guy Cohen, Mohegan Lake, NY (US); Conal E. Murray, Yorktown Heights, NY (US); Michael J. Rooks, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/731,241

(22) Filed: Mar. 25, 2010

(65) Prior Publication Data

US 2011/0233522 A1 Sep. 29, 2011

(51) Int. Cl.
*H01L 29/267* (2006.01)
*H01L 21/84* (2006.01)
(52) U.S. Cl. .......... 438/151; 257/E29.081; 257/E21.703
(58) Field of Classification Search .................. 438/151; 257/24, E29.081, E21.703
See application file for complete search history.

(56) References Cited

U.S. PATENT DOCUMENTS

| | | |
|---|---|---|
| 2005/0020020 A1 | 1/2005 | Collaert et al. |
| 2007/0004124 A1 | 1/2007 | Suk et al. |
| 2007/0017439 A1 | 1/2007 | Xianyu et al. |
| 2008/0050918 A1 | 2/2008 | Damlencourt |
| 2008/0061284 A1* | 3/2008 | Chu et al. ........................ 257/9 |
| 2008/0079041 A1 | 4/2008 | Suk et al. |
| 2008/0121932 A1 | 5/2008 | Ranade |
| 2008/0135949 A1 | 6/2008 | Lo et al. |
| 2008/0191196 A1 | 8/2008 | Lu et al. |
| 2009/0072279 A1 | 3/2009 | Moselund et al. |
| 2009/0090934 A1 | 4/2009 | Tezuka et al. |
| 2009/0117741 A1 | 5/2009 | Heath et al. |
| 2009/0302372 A1 | 12/2009 | Chang et al. |
| 2009/0311835 A1 | 12/2009 | Chu et al. |
| 2011/0168982 A1* | 7/2011 | Bangsaruntip et al. ......... 257/38 |

FOREIGN PATENT DOCUMENTS

WO W02010018976 A2 2/2010

OTHER PUBLICATIONS

Liow et al, Strained Silicon Nanowire Transistors With Germanium Source and Drain Stressors, Nov. 2008, IEEE Transactions on Electron Devices, vol. 55, pp. 3048-3055.*

T. Tezuka et al., "Fabrication of Strained Si on an ultrathin SiGe-on-Insulator Virtual Substrate With a High-Ge Fraction," Applied Physics Letters, vol. 79. No. 12 (Sep. 2001).

(Continued)

*Primary Examiner* — Calvin Lee
*Assistant Examiner* — Monica D Harrison
(74) *Attorney, Agent, or Firm* — Vazken Alexanian; Michael J. Chang, LLC

(57) ABSTRACT

Techniques for embedding silicon germanium (e-SiGe) source and drain stressors in nanoscale channel-based field effect transistors (FETs) are provided. In one aspect, a method of fabricating a FET includes the following steps. A doped substrate having a dielectric thereon is provided. At least one silicon (Si) nanowire is placed on the dielectric. One or more portions of the nanowire are masked off leaving other portions of the nanowire exposed. Epitaxial germanium (Ge) is grown on the exposed portions of the nanowire. The epitaxial Ge is interdiffused with Si in the nanowire to form SiGe regions embedded in the nanowire that introduce compressive strain in the nanowire. The doped substrate serves as a gate of the FET, the masked off portions of the nanowire serve as channels of the FET and the embedded SiGe regions serve as source and drain regions of the FET.

20 Claims, 5 Drawing Sheets

OTHER PUBLICATIONS

M. Li et al., "Experimental Investigation on Superior PMOS Performance of Uniaxial Strained <110> Silicon Nanowire Channel by Embedded SiGe Source/Drain," 2007 IEEE International Electron Device Meeting (IEDM '07). pp. 899-902 (Dec. 2007).

Liow et al., "Strained Silicon Nanowire Transistors With Germanium Source and Drain Stressors," IEEE Transactions on Electron Devices, vol. 55, No. 11. pp. 3048-3055 (Nov. 2008).

* cited by examiner

CROSS-SECTIONAL VIEW

TOP-DOWN VIEW

CROSS-SECTIONAL VIEW                TOP-DOWN VIEW
     FIG. 8                            FIG. 9
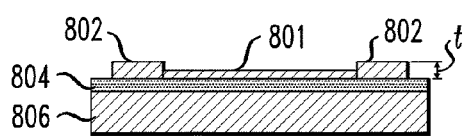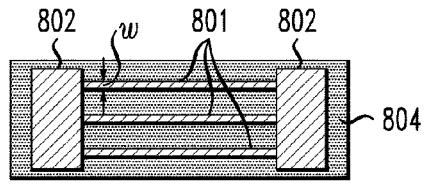
     FIG. 10                           FIG. 11
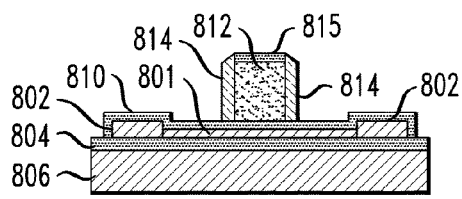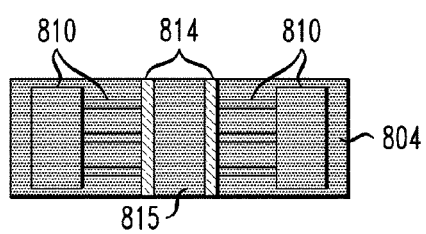
     FIG. 12                           FIG. 13
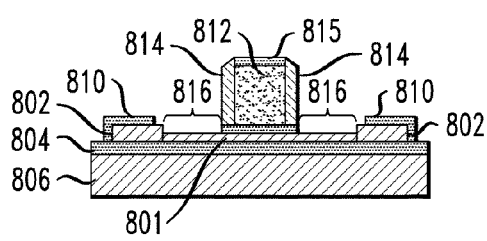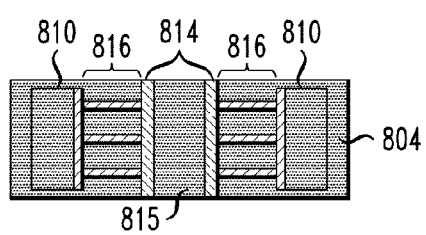
     FIG. 14                           FIG. 15
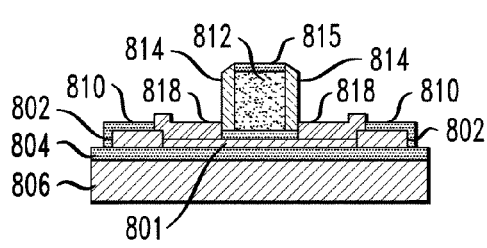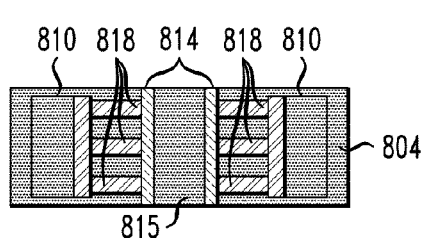
     FIG. 16                           FIG. 17
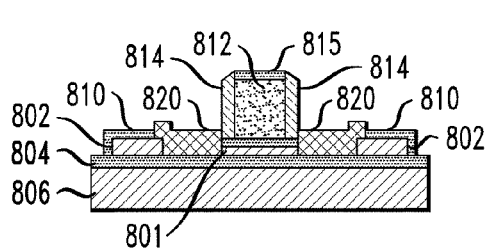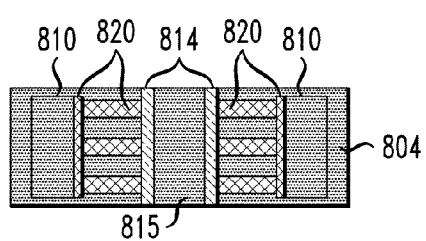

CROSS-SECTIONAL VIEW

TOP-DOWN VIEW

P-FET WITH A STRAINED NANOWIRE CHANNEL AND EMBEDDED SIGE SOURCE AND DRAIN STRESSORS

FIELD OF THE INVENTION

The present invention relates to nanoscale channel-based field effect transistors (FETs), such as FinFETs and nanowire FETs, and more particularly, to techniques for embedding silicon germanium (e-SiGe) source and drain stressors in nanoscale channel-based FETs.

BACKGROUND OF THE INVENTION

Embedded silicon germanium (e-SiGe) sources and drains have been used successfully in bulk planar p-channel field effect transistors (p-FETs) as an efficient method to induce strain in the p-FET channel. In general a FET includes a source and a drain connected by at least one channel and a gate that regulates current flow through the channel(s). The compressive strain increases the hole mobility and therefore the device drive current.

The process used for e-SiGe sources and drains in bulk planar p-FETs includes etching out the source and drain region of the p-FET in silicon (Si) and then epitaxially growing a source and a drain region from SiGe. Due to the lattice mismatch between SiGe and Si (with SiGe having a large lattice constant), the source and drain regions induce a compressive strain in the p-FET channel.

For further scaling of complementary metal-oxide semiconductor (CMOS) technology, non-planar devices such as FinFETs and nanowire FETs exhibit superior short channel control than is achievable with planar bulk FETs. Unfortunately, it is not possible to use e-SiGe in its present known form to strain the FET channel in these non-planar devices. The main reason the e-SiGe process is not compatible with these non-planar FET geometries is that the channel is made up of a very thin body (such as a fin or a nanowire). Etching out the channel extensions in order to replace them with epitaxial SiGe is not possible since there is no substrate from which epitaxial SiGe can seed.

Therefore, techniques integrating e-SiGe sources and drains with non-planar FET devices, such as FinFETs and nanowire FETs, would be desirable.

SUMMARY OF THE INVENTION

The present invention provides techniques for embedding silicon germanium (e-SiGe) source and drain stressors in nanoscale channel-based field effect transistors (FETs). In one aspect of the invention, a method of fabricating a FET includes the following steps. A doped substrate having a dielectric thereon is provided. At least one silicon (Si) nanowire is placed on the dielectric. One or more portions of the nanowire are masked off leaving other portions of the nanowire exposed. Epitaxial germanium (Ge) is grown on the exposed portions of the nanowire. The epitaxial Ge is interdiffused with Si in the nanowire to form SiGe regions embedded in the nanowire that introduce compressive strain in the nanowire. The doped substrate serves as a gate of the FET, the masked off portions of the nanowire serve as channels of the FET and the embedded SiGe regions serve as source and drain regions of the FET.

In another aspect of the invention, a FET is provided. The FET includes a doped substrate having a dielectric thereon; at least one Si nanowire disposed on the dielectric; a mask over one or more portions of the nanowire; and a first SiGe region and a second SiGe region embedded in the nanowire that introduce compressive strain in the nanowire, wherein the doped substrate serves as a gate of the FET, the portions of the nanowire under the mask serve as channels of the FET, the first embedded SiGe region serves as a source region of the FET and the second embedded SiGe region serves as a drain region of the FET.

In yet another aspect of the invention, another method of fabricating a FET is provided. The method includes the following steps. A silicon-on-insulator (SOI) wafer is provided. The SOI wafer has a SOI layer over a buried oxide (BOX). A plurality of nanowires and pads are formed in the SOI layer with the pads attached at opposite ends of the nanowires in a ladder-like configuration. A thermal oxide is formed over the nanowires and pads. A dummy gate is formed on the thermal oxide surrounding at least a portion of each of the nanowires. The thermal oxide is removed from portions of the nanowires extending out from the gate and from at least a portion of each of the pads. Epitaxial Ge is grown on the portions of the nanowires extending out from the gate and the portion of the pads from which the thermal oxide is removed. The epitaxial Ge is interdiffused with Si in the nanowires and pads to form embedded SiGe source and drain regions that introduce compressive strain in the nanowires. A dielectric film is deposited over the dummy gate and embedded SiGe source and drain regions. The dummy gate is removed to introduce additional strain in the nanowires. The dummy gate is replaced with a replacement gate, wherein portions of the nanowires surrounded by the replacement gate serve as channels of the FET.

In still yet another aspect of the invention, another FET is provided. The FET includes a plurality of nanowires and pads, with the pads attached at opposite ends of the nanowires in a ladder-like configuration, formed in a SOI layer of an SOI wafer; a gate surrounding at least a portion of each of the nanowires; and SiGe source and drain regions embedded in portions of the nanowires extending out from the gate that introduce compressive strain in the nanowires, wherein portions of the nanowires surrounded by the gate serve as channels of the FET.

A more complete understanding of the present invention, as well as further features and advantages of the present invention, will be obtained by reference to the following detailed description and drawings.

BRIEF DESCRIPTION OF THE DRAWINGS

FIG. 8 is a cross-sectional diagram illustrating a starting structure for the fabrication of a nanowire FET having one or more nanowires and pads etched into a silicon-on-insulator (SOI) wafer according to an embodiment of the present invention;

FIG. 9 is a diagram illustrating a top-down view of the structure of FIG. 8 according to an embodiment of the present invention;

FIG. 10 is a cross-sectional diagram illustrating a thermal oxide having been formed over the nanowires and pads, a dummy gate having been formed on the thermal oxide over a portion of the nanowires and spacers having been formed on opposite sides of the dummy gate according to an embodiment of the present invention;

FIG. 11 is a diagram illustrating a top-down view of the structure of FIG. 10 according to an embodiment of the present invention;

FIG. 12 is a cross-sectional diagram illustrating source and drain extensions and portions of the pads having been exposed by removing portions of the thermal oxide according to an embodiment of the present invention;

FIG. 13 is a diagram illustrating a top-down view of the structure of FIG. 12 according to an embodiment of the present invention;

FIG. 14 is a cross-sectional diagram illustrating epitaxial Ge having been grown on the source and drain extensions and portions of the pads according to an embodiment of the present invention;

FIG. 15 is a diagram illustrating a top-down view of the structure of FIG. 14 according to an embodiment of the present invention;

FIG. 16 is a cross-sectional diagram illustrating interdiffusion of the epitaxial Ge and silicon (Si) of the source and drain extensions and portions of the pads having been used to form e-SiGe source and drain regions according to an embodiment of the present invention;

FIG. 17 is a diagram illustrating a top-down view of the structure of FIG. 16 according to an embodiment of the present invention;

DETAILED DESCRIPTION OF PREFERRED EMBODIMENTS

Provided herein are techniques for fabricating non-planar field effect transistors (FETs), such as FinFETs or nanowire FETs, that involve forming embedded silicon germanium (e-SiGe) sources and drains as a way to induce compressive strain in the FET channels. As highlighted above, this compressive strain advantageously increases hole mobility and therefore the device drive current. In general a FET includes a source and a drain connected by at least one channel and a gate (typically separated from the channel(s) by a gate dielectric) that regulates electron flow through the channel(s).

The present techniques will now be described by way of reference to two exemplary processes involving the fabrication of nanowire FETs. In one of the processes, shown illustrated in FIGS. 1-7 (described below) a bottom-up silicon (Si) nanowire fabrication technique is employed in the production of a FET having e-SiGe sources and drains. In another one of the processes, shown illustrated in FIGS. 8-23 (described below) a top-down Si nanowire fabrication technique is employed in the production of a FET having e-SiGe sources and drains. The terms "bottom-up" and "top-down" in the context of nanowire FETs, as known to those of skill in the art, generally refer to whether the nanowire(s) are synthesized using a method such as vapor-liquid-solid epitaxy or are fabricated by patterning a solid film using conventional methods such as lithography and reactive ion etching (RIE), respectively.

Figure 1:
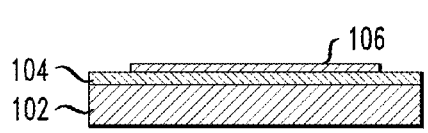
FIG. 1 is a cross-sectional diagram illustrating a starting structure for the fabrication of a nanowire field effect transistor (FET) having a nanowire on a nitride film over a doped substrate according to an embodiment of the present invention.

A demonstration of the present techniques in the context of a bottom-up Si nanowire fabrication process will now be described by way of reference to FIGS. 1-7. FIG. 1 is a cross-sectional diagram illustrating a starting structure for the process. Specifically, a p$^{++}$ doped Si substrate 102 is provided. A p$^{++}$ doped substrate, as known in the art, is a heavily doped p-type semiconductor substrate. For example, p-type doping is obtained in Si with impurities such as boron (B) and indium (In) that substitute Si atoms in the crystal. For Si, when the concentration of these substitutional impurities is larger than several times $1 \times 10^{19}$ cm$^{-3}$ the semiconductor is considered heavily doped. The doped substrate is used for back-gating the nanowire (channel). A top surface of substrate 102 is coated with a nitride film 104. According to an exemplary embodiment, nitride film 104 is made of silicon nitride ($Si_3N_4$). Nitride film 104 serves as a gate dielectric.

Figure 2:
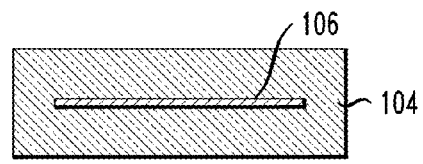
FIG. 2 is a diagram illustrating a top-down view of the structure of FIG. 1 according to an embodiment of the present invention.

As shown in FIG. 1, a Si nanowire 106 is placed on nitride film 104. Prior to the placement of nanowire 106 on nitride film 104 alignment marks (not shown) are etched into the wafer. The relative position of nanowire 106 with respect to the alignment marks is measured and used later on to align the gate and contact mask to the nanowire. The use of alignment marks in nanowire placement is known to those of skill in the art and thus is not described further herein. It is notable however that when high energy (e.g., 100 kiloelectron volt (keV)) electron-beam (e-beam) lithography is used to pattern a channel mask (see description of FIG. 3, below) the alignment marks are preferably in the form of trenches that are greater than or equal to 1.0 micrometer (μm) deep in order to provide sufficient contrast for e-beam imaging. FIG. 2 is a diagram illustrating another perspective, i.e., a top-down view, of the structure of FIG. 1.

Figure 3:
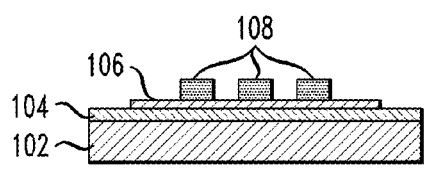
FIG. 3 is a cross-sectional diagram illustrating a mask, e.g., a hydrogen silsesquioxane (HSQ) mask, having been patterned over the nanowire and nitride film according to an embodiment of the present invention.
Figure 4:
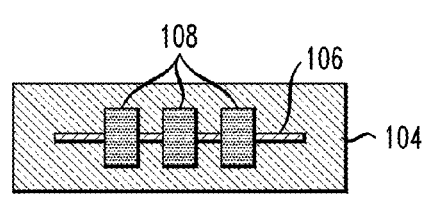
FIG. 4 is a diagram illustrating a top-down view of the structure of FIG. 3 according to an embodiment of the present invention.

FIG. 3 is a cross-sectional diagram illustrating a mask 108 having been patterned over nanowire 106 and nitride film 104. According to an exemplary embodiment, mask 108 is formed from hydrogen silsesquioxane (HSQ) (although any other patternable dielectrics would suffice). In this example, HSQ is first blanket deposited over nanowire 106 and nitride film 104 using a spin-coating process. Next e-beam lithography is used to pattern the HSQ. The patterned HSQ masks a channel region of the FET, while the exposed (unmasked) regions of nanowire 106 from which the HSQ was removed will serve as source and drain regions of the FET. The patterned HSQ is then hardened by annealing. Typical annealing conditions are 900 degrees Celsius (° C.) in nitrogen ($N_2$) for 30 minutes. The hardened HSQ has properties similar to thermal silicon dioxide ($SiO_2$) (thermal oxide), with a similar etch rate in diluted hydrofluoric acid (HF). FIG. 4 is a diagram illustrating another perspective, i.e., a top-down view, of the structure of FIG. 3.

Figure 5:
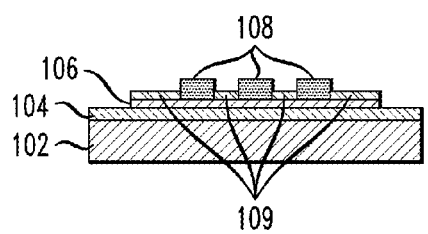
FIG. 5 is a cross-sectional diagram illustrating epitaxial germanium (Ge) having been selectively grown on the nanowire according to an embodiment of the present invention.
Figure 6:
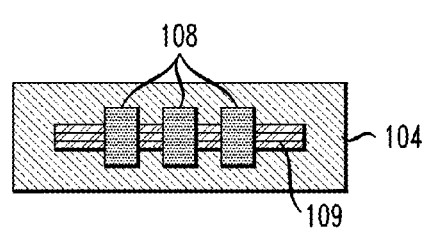
FIG. 6 is a diagram illustrating a top-down view of the structure of FIG. 5 according to an embodiment of the present invention.

The structure is then etched in HF to remove any native oxide from the exposed regions of the Si nanowire. A typical etch will include the use of 100:1 diluted HF (DHF) (the dilution is done with water ($H_2O$)) for 60 seconds. The hardened HSQ is etched very little (about two nanometers (nm)) during this etch. Thus, the HSQ mask remains intact during this HF dip, which is the result of the hardening process described immediately above. Specifically, if not hardened, the etch rate of spin-coated HSQ in HF is many times faster than that of thermal oxide. Next, a selective growth of epitaxial germanium (Ge) is performed. Specifically, FIG. 5 is a cross-sectional diagram illustrating epitaxial Ge 109 having been selectively grown on nanowire 106. To obtain a continuous and smooth Ge growth over nanowire 106, a low growth temperature of about 300° C. may be used. Alternatively, the growth can be carried out in two steps, with the first step being a seeding step at a lower temperature followed by a second growth step at a higher temperature. See, for example, the description of FIG. 24, below. Precursors such as germane ($GeH_4$) show excellent deposition selectivity over $SiO_2$ and $Si_3N_4$ even at low growth temperatures. As shown in FIG. 5, Ge deposits only over the exposed regions of Si nanowire 106 (i.e., in the source and drain regions of the FET) due to the growth selectivity. FIG. 6 is a diagram illustrating another perspective, i.e., a top-down view, of the structure of FIG. 5. As shown in FIG. 6, since Ge deposits only over the exposed regions (i.e., on the top and sides) of the nanowire, epitaxial Ge 109 appears faceted. Doping of the source and drain regions may be obtained by in-situ doping during the Ge epitaxy, or alternatively by a conventional ion-implantation (prior to the thermal mixing, see below). When in-situ doping is used, a boron source such as diborane ($B_2H_6$) is added to the $GeH_4$ flow. When ion-implantation is used boron or boron difluoride ($BF_2$) is implanted into the source and drain regions. Note that the channel region remains undoped since it is masked by the HSQ mask 108. It is also possible to substitute expitaxial Ge 109 with an epitaxial $Si_xGe_{1-x}$ alloy. In general, the addition of Si requires higher growth temperatures. Additionally, with many Si precursors such as silane ($SiH_4$) the growth selectivity (i.e., the lack of Si deposition on dielectric surfaces) is lost. To maintain growth selectivity, hydrochloric acid (HCL) can be added to the growth mixture. Alternatively, chlorine-containing Si precursors such as silicon-tetrachloride ($SiCl_4$) and dichlorosilane ($H_2SiCl_2$) are frequently used. The growth temperature depends on the precursor used. For example, when $SiH_4$ is used a growth temperature higher than 500° C. is needed. The content of Si (x) in the $Si_xGe_{1-x}$ alloy is controlled by adjusting the flow ratio (or partial pressure) of $SiH_4$ to $GeH_4$. The incorporation of Si in the SiGe alloy also depends on the growth temperature.

Figure 7:
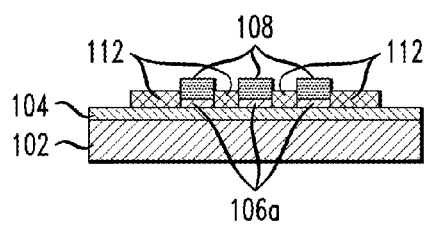
FIG. 7 is a cross-sectional diagram illustrating thermal mixing having been used to drive the epitaxial Ge into the nanowire in source and drain regions of the FET to form embedded-silicon germanium (SiGe) sources and drains according to an embodiment of the present invention.

FIG. 7 is a cross-sectional diagram illustrating thermal mixing having been used to drive epitaxial Ge 109 into Si nanowire 106 in source and drain regions 112 to form e-SiGe sources and drains. The mixing of Ge in Si is achieved by capping the source and drain regions with a dielectric film such as $SiO_2$ (not shown) and annealing at a temperature of from about 500° C. to about 1,000° C. The melting temperature of Ge is about 937° C. An annealing temperature that forms a Ge melt would result in a more uniform SiGe alloy in the source and drain regions, but could also lead to encroachment of Ge into the channel region. As shown in FIG. 7, portions 106a of the nanowire remain under HSQ masks 108. These portions 106a will serve as channels of the FET. As highlighted above, the doped substrate serves as a (back) gate of the FET with the nitride film thereon serving as the gate dielectric.

Optionally, the Ge concentration in source and drain regions 112 can be increased using Ge condensation. In this process the source and drain surfaces are oxidized at a temperature of from about 900° C. to about 1,100° C. During the oxidation process the Ge atoms are repelled from the SiGe oxide layer that forms and condense in the remaining unoxidized SiGe alloy. As a result, the Ge concentration in the remaining SiGe alloy increases. For more information on Ge condensation, see T. Tezuka et al., "Fabrication of Strained Si on an ultrathin SiGe-on-Insulator Virtual Substrate With a High-Ge Fraction," Applied Physics Letters, Vol. 79, No. 12 (September 2001), the contents of which are incorporated by reference herein. Contacts to the source and drain and back-gate are formed (not shown) to complete the device fabrication. These contacts and suitable processes for the formation thereof are known to those of skill in the art and thus are not described further herein.

A demonstration of the present techniques in the context of a top-down Si nanowire fabrication process will now be described by way of reference to FIGS. 8-23. FIG. 8 is a cross-sectional diagram illustrating a starting structure for the process that includes one or more nanowires formed in a silicon-on-insulator (SOI) wafer. A SOI wafer typically comprises a SOI layer over a buried oxide (BOX) and a substrate adjacent to a side of the BOX opposite the SOI layer. In the exemplary embodiment shown illustrated in FIG. 8, a plurality of nanowires 801 with pads 802 attached at opposite ends thereof have been etched into the SOI layer, e.g., using conventional lithography and RIE processes. As shown, a BOX 804 (e.g., comprising $SiO_2$) and a substrate 806 are present beneath the etched SOI layer. As will be further apparent from reference to FIG. 9 (described below), the nanowires 801 and pads 802 have a ladder-like configuration, i.e., with the nanowires connecting the pads much like rungs of a ladder. FIG. 9 is a diagram illustrating another perspective, i.e., a top-down view, of the structure of FIG. 8. As shown in FIG. 9, nanowires 801 and pads 802 have a ladder-like configuration. Each of the nanowires has a rectangular cross-section that is set by the nanowire width w and the SOI layer thickness t (see FIG. 8).

FIG. 10 is a cross-sectional diagram illustrating a thermal oxide 810 having been formed over nanowires 801 and pads 802, a dummy gate 812 having been formed on thermal oxide 810 over a portion of nanowires 801 and spacers 814 having been formed on opposite sides of dummy gate 812. According to an exemplary embodiment, thermal oxide 810 is formed by heating the structure to a temperature of from about 700° C. to about 1,000° C. in an oxygen-containing environment to cause, e.g., $SiO_2$, to form on the exposed surfaces of the (Si) nanowires and pads. A dummy gate material, such as polysilicon (poly-Si) is then blanket deposited over the structure and patterned (using conventional lithography and etching techniques) to form dummy gate 812. Spacers 814 may be similarly formed by blanket depositing a suitable spacer material, such as $Si_3N_4$, over the structure and then using a standard etch process, such as RIE, to define spacers 814. Both poly-Si and $Si_3N_4$ can be etched selectively (e.g., by RIE) with respect to the thermal oxide. The film on top of dummy gate 812 is a hard mask 815 that was used to mask the dummy gate line during the gate etch. Hard mask 815 can be a $SiO_2$ film or a $Si_3N_4$ film. In principle, the dummy gate material is blanket deposited. A $SiO_2$ or $Si_3N_4$ film (the hard mask material) is deposited over the dummy gate material. Photoresist is spin coated and patterned using lithography. The photoresist image is transferred to the $SiO_2$ or $Si_3N_4$ film by etching (e.g., RIE). The resist is stripped and RIE is used to etch the dummy gate, with the patterned $SiO_2$ or $Si_3N_4$ serving as hard mask 815. The dummy gate will either fully or partially surround the nanowires. See description of surrounding and omega gates below. A dummy gate is used to mask the "channel" portions of the nanowires and will be removed later in the process and replaced with a replacement gate so as to impart additional strain in the channels, as described in further detail below. FIG. 11 is a diagram illustrating another perspective, i.e., a top-down view, of the structure of FIG. 10.

At this point in the process it is helpful to note that the portions of the nanowires surrounded by dummy gate 812 (as highlighted above) will serve as channels of the FET (also collectively referred to herein as a channel region of the FET), and portions of the nanowires extending out from dummy gate 812 as well as the pads will be used to form source and drain regions of the FET. The portions of the nanowires extending out from dummy gate 812 may also be referred to herein as source and drain extensions, or simply extensions, so as to distinguish them from the pads and channels.

FIG. 12 is a cross-sectional diagram illustrating the source and drain extensions and portions of the pads (i.e., regions labeled 816 in FIG. 12) having been exposed by removing (e.g., through etching) exposed portions of thermal oxide 810. The partial exposure of the pads is optional. For example, it is possible to remove the oxide from the source and drain extensions and from all regions of the pad. It is notable that if a partial exposure is desired then an additional lithography step is needed. A typical etch that can be used to remove thermal oxide 810 includes the use of 100:1 DHF. FIG. 13 is a diagram illustrating another perspective, i.e., a top-down view, of the structure of FIG. 12.

After the etch to remove the exposed portions of thermal oxide 810, a selective growth of epitaxial Ge on regions 816 is performed. To obtain a continuous and smooth Ge growth over the source and drain extensions and portions of the pads, a low growth temperature of about 300° C. is used in the presence of a Ge precursor, such as $GeH_4$ (see above). Alternatively, the growth can be carried out in two steps, with the first step being a seeding step at a lower temperature followed by a second growth step at a higher temperature. See, for example, the description of FIG. 24, below. The structure following the Ge growth is shown in FIG. 14. Specifically, FIG. 14 is a cross-sectional diagram illustrating epitaxial Ge 818 having been grown on the source and drain extensions and portions of the pads (i.e., in regions 816, see FIG. 12, described above). FIG. 15 is a diagram illustrating another perspective, i.e., a top-down view, of the structure of FIG. 14. It is also possible to substitute the expitaxial Ge with an epitaxial $Si_xGe_{1-x}$ alloy, as described above. The growth parameters for SiGe are the same as discussed above. Doping of the source and drain regions may be obtained by in-situ doping during the Ge epitaxy, or alternatively by a conventional ion-implantation (prior to the thermal mixing, see below). When in-situ doping is used, a boron source such as diborane ($B_2H_6$) is added to the $GeH_4$ flow. When ion-implantation is used boron or boron difluoride ($BF_2$) is implanted into the source and drain regions.

FIG. 16 is a cross-sectional diagram illustrating interdiffusion of epitaxial Ge 818 and the Si of the source and drain extensions and portions of the pads having been used to form e-SiGe source and drain regions 820. According to an exemplary embodiment, thermal mixing is used to drive epitaxial Ge 818 into the Si of the source and drain extensions and the portions of the pads. The mixing of Ge in Si is achieved by capping the source and drain extensions and the portions of the pads with a dielectric film such as $SiO_2$ and annealing at a temperature of from about 500° C. to about 1,000° C. The melting temperature of Ge is about 937° C. An annealing temperature that forms a Ge melt would result in a more uniform SiGe alloy in the source drain regions, but could also lead to encroachment of Ge into the channel. Optionally, the Ge concentration in the source and drain regions can be increased by Ge condensation. Techniques for increasing Ge concentration by condensation were described in detail above. FIG. 17 is a diagram illustrating another perspective, i.e., a top-down view, of the structure of FIG. 16.

Figure 18:
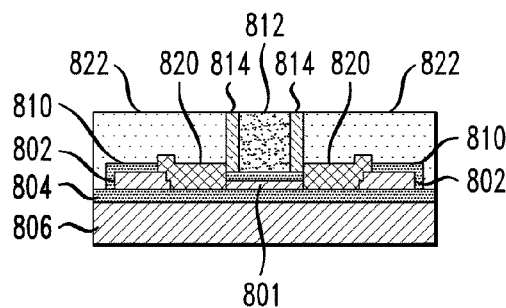
FIG. 18 is a cross-sectional diagram illustrating chemical mechanical polishing (CMP) having been used to planarize a dielectric film deposited over the dummy gate, the spacers and the e-SiGe source and drain regions according to an embodiment of the present invention.
Figure 19:
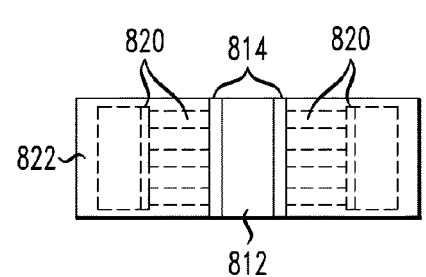
FIG. 19 is a diagram illustrating a top-down view of the structure of FIG. 18 according to an embodiment of the present invention.

A thick dielectric film is then deposited over the structure, i.e., over dummy gate 812, spacers 814 and e-SiGe source and drain regions 820. The dielectric film has to be thicker than the dummy gate height or otherwise planarization would not be possible. A typical dummy gate height is from about 50 nm to about 100 nm. So in that instance the dielectric film is preferably at least 100 nm thick. FIG. 18 is a cross-sectional diagram illustrating chemical mechanical polishing (CMP) having been used to planarize the dielectric film, resulting in dielectric film 822. According to an exemplary embodiment, dielectric film 822 comprises an oxide. As shown in FIG. 18, the CMP also serves to expose a top of dummy gate 812 (i.e., if the hard mask 815 is chosen to be of a similar material as dielectric film 822, and thus has the same polishing properties as dielectric film 822, then hard mask 815 can be removed by the CMP). Alternatively, hard mask 815 can be chosen such that it works as a CMP stop layer (i.e., is not easily polished). Once the polish pad reaches hard mask 815 the removal of material by CMP nearly stops. After the CMP, the hard mask 815 is then removed by a selective etch step. FIG. 19 is a diagram illustrating another perspective, i.e., a top-down view, of the structure of FIG. 18.

Figure 20:
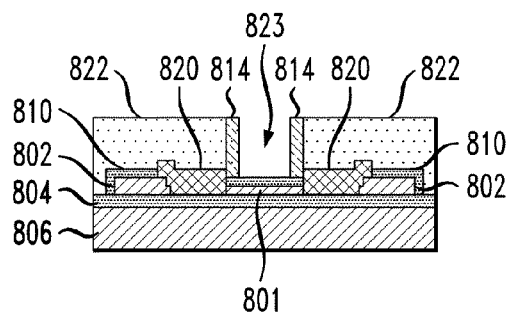
FIG. 20 is a cross-sectional diagram illustrating the dummy gate having been removed to increase strain in the channel according to an embodiment of the present invention.
Figure 21:
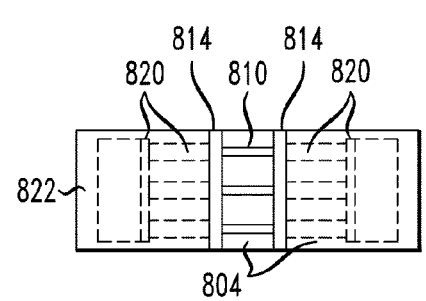
FIG. 21 is a diagram illustrating a top-down view of the structure of FIG. 20 according to an embodiment of the present invention.

To induce higher strain in the channels, dummy gate 812 is removed (e.g., using a conventional selective etching process) to expose the channel region (which as described above is defined as the portions of the nanowires surrounded by the dummy gate, and subsequently surrounded by the replacement gate as described below). See for example FIG. 20. FIG. 20 is a cross-sectional diagram illustrating dummy gate 812 having been removed. The etching of the gate leads to higher additional strain in the channels because the nanowires are no longer held by the dummy gate material, and can now respond to the source drain stress and any stress due to dielectric film 822. As shown in FIG. 20, removal of the dummy gate will leave a trench 823 in dielectric film 822 the sidewalls of which are lined by spacers 814. Removal of the dummy gate will also expose portions of thermal oxide 810 thereunder over the nanowires (at the bottom of the trench), which can also be removed depending on the requirements of the finalized FET configuration. FIG. 21 is a diagram illustrating another perspective, i.e., a top-down view, of the structure of FIG. 20.

Figure 22:
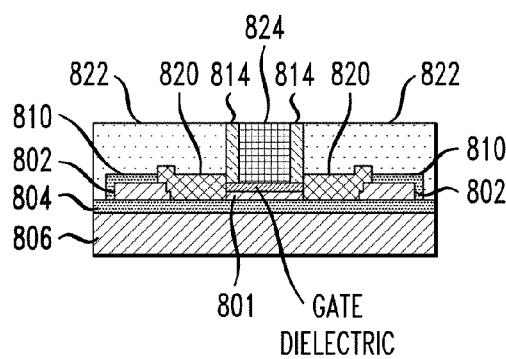
FIG. 22 is a cross-sectional diagram illustrating a replacement gate having been formed in place of the removed dummy gate according to an embodiment of the present invention.
Figure 23:
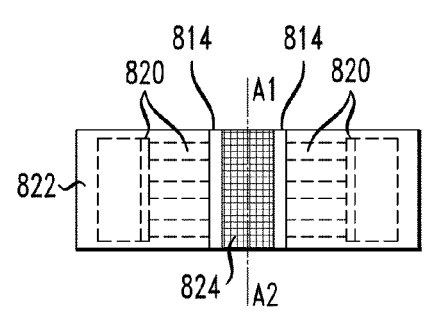
FIG. 23 is a diagram illustrating a top-down view of the structure of FIG. 22 according to an embodiment of the present invention.

A replacement gate is then formed in place of the removed dummy gate. As highlighted above, the portions of thermal oxide 810 over the nanowires, exposed by removal of the dummy gate, can also be removed (e.g., by etching) and replaced using a conventional deposition process with a suitable gate dielectric material. By way of example only, if the replacement gate is a metal gate, then a high-k dielectric may be deposited in place of the thermal oxide. FIG. 22 is a cross-sectional diagram illustrating a replacement gate 824 having been formed in place of the removed dummy gate. Conventional processes may be used to form replacement gate 824. By way of example only, a gate conductor (such as a suitable gate metal) can be deposited over the structure filling trench 823. The gate conductor can be polished down to the surface of dielectric film 822 using CMP for example. FIG. 23 is a diagram illustrating another perspective, i.e., a top-down view, of the structure of FIG. 22. Replacement gate 824 locks in (i.e., serves to hold and maintain) the additional strain in the channels introduced by removal of the dummy gate.

Figure 25:
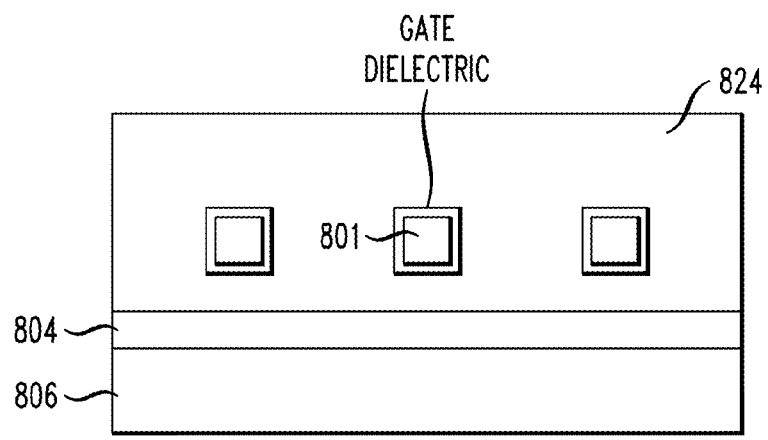
FIG. 25 is a cross-sectional diagram illustrating an exemplary surrounding gate configuration that may be achieved using the present techniques according to an embodiment of the present invention.
Figure 26:
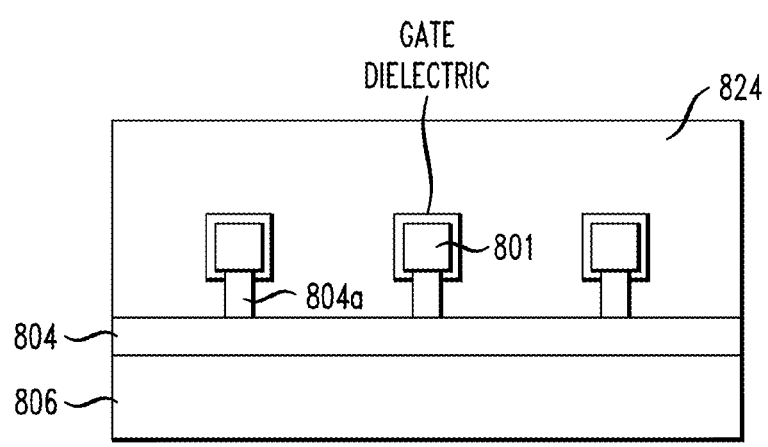
FIG. 26 is a cross-sectional diagram illustrating an exemplary omega-gate configuration that may be achieved using the present techniques according to an embodiment of the present invention.

It is notable that after the removal of the dummy gate two gate geometries, namely a surrounding gate and an omega-gate can be fabricated. Examples of a surrounding gate and an omega gate are shown in FIGS. 25 and 26, respectively (both of which are described below). To form a surrounding gate, where the gate fully surrounds the portion of each of the nanowires that serves as the channel region, the BOX 804 is etched to release the nanowires. A conformal gate dielectric deposition followed by a conformal gate conductor deposition (i.e., the replacement gate) is carried out to fully encapsulate the channel region. Alternatively, in the case where the BOX 804 is in contact with the bottom part of each nanowire 801, the deposited replacement gate forms an omega-shaped gate.

Figure 24:
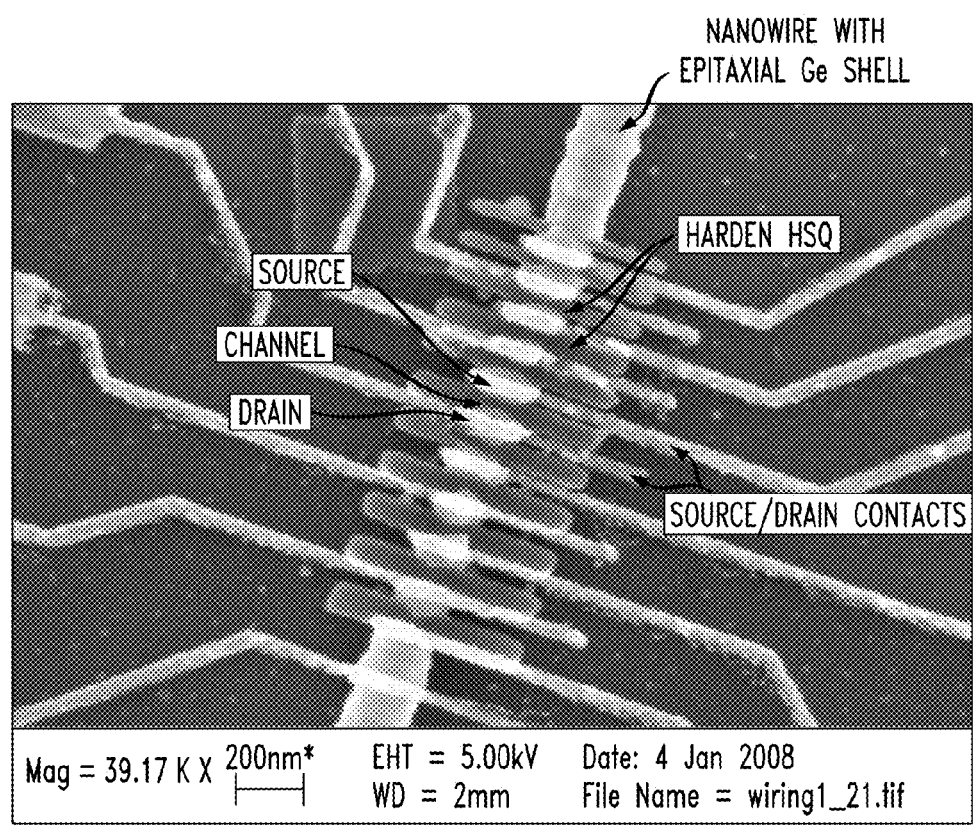
FIG. 24 is an image of several FETs fabricated using the present techniques in conjunction with a bottom-up Si nanowire fabrication process according to an embodiment of the present invention.

FIG. 24 is an image of several FETs fabricated using the present techniques in conjunction with a bottom-up Si nanowire fabrication process (for example, as was described in conjunction with the description of FIGS. 1-7, above). Specifically, several FETs with different channel lengths were fabricated on the same nanowire. Since a global back-gate is used in this scheme, the channel length of each FET is set by the width of the patterned HSQ mask (i.e., the spacing between the source and drain regions). The Ge epitaxy was carried out in an ultra-high vacuum-chemical vapor deposition (UHV-CVD) chamber using $GeH_4$ as the Ge precursor. The growth consisted of two steps: a seeding step which was carried out at 300° C., and led to a continuous Ge shell over the nanowire, and a second growth step which is carried out at 400° C. A self-aligned boron implantation was used to dope the source and drain regions. Metal lines connecting each of the source and drain regions were patterned to form the FET contacts.

FIG. 25 is a cross-sectional diagram illustrating an exemplary surrounding gate configuration that may be achieved using the present techniques. See, for example, the description of FIGS. 22 and 23, above. In fact, what is shown in FIG. 25 is a cross-sectional cut along line A1-A2 through the structure of FIG. 23 when the structure has a surrounding gate. All of the structures present in FIG. 25 were described in detail above and that description is incorporated herein. In FIG. 25, each of the portions of nanowires 801 that serve as channels of the device are completely surrounded by the gate dielectric and the replacement gate 824. This is possible since a portion of BOX 804 has been removed to suspend the nanowires in this region (i.e., the nanowires have been fully released). In this embodiment, the BOX is etched just enough so that the nanowires are no longer held by the BOX and can be fully encapsulated by the replacement gate.

FIG. 26 is a cross-sectional diagram illustrating an exemplary omega-gate configuration that may be achieved using the present techniques. See, for example, the description of FIGS. 22 and 23, above. In fact, what is shown in FIG. 26 is a cross-sectional cut along line A1-A2 through the structure of FIG. 23 when the structure has an omega-gate. All of the structures present in FIG. 26 were described in detail above and that description is incorporated herein. In FIG. 26, each of the portions of nanowires 801 that serve as channels of the device are partially surrounded by the gate dielectric and the replacement gate 824. This configuration is the result of a small portion 804a of BOX 804 that is attached to each of the nanowires in this region. Thus, the replacement gate (and gate dielectric) cannot fully surround the nanowires and when the replacement gate is formed it takes on a shape resembling the Greek symbol omega ($\Omega$).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a field effect transistor (FET), comprising the steps of:
    providing a doped substrate having a dielectric thereon;
    placing at least one silicon nanowire on the dielectric;
    masking off one or more portions of the nanowire leaving other portions of the nanowire exposed;
    growing epitaxial germanium on the exposed portions of the nanowire;
    interdiffusing the epitaxial germanium with silicon in the nanowire to form silicon germanium regions embedded in the nanowire that introduce compressive strain in the nanowire,
    wherein the doped substrate serves as a gate of the FET, the masked off portions of the nanowire serve as channels of the FET and the embedded silicon germanium regions serve as source and drain regions of the FET; and
    further increasing a concentration of germanium in the silicon germanium regions using germanium condensation.

2. The method of claim 1, wherein the doped substrate comprises a $p^{++}$ doped silicon substrate.

3. The method of claim 1, wherein the dielectric comprises a nitride film.

4. The method of claim 1, wherein the epitaxial germanium is grown on the exposed portions of the nanowire at a temperature of about 300° C. in the presence of a germanium precursor.

5. The method of claim 4, wherein the germanium precursor comprises germane.

6. The method of claim 1, wherein the epitaxial germanium is interdiffused with the silicon in the nanowire using thermal mixing.

7. The method of claim 1, wherein the one or more portions of the nanowire are masked off using a hydrogen silsesquioxane mask.

8. The method of claim 1, further comprising the step of:
doping the silicon germanium regions using one of in-situ doping and ion-implantation.

9. A method of fabricating a FET, comprising the steps of:
providing a silicon-on-insulator (SOI) wafer having a SOI layer over a buried oxide (BOX);
forming a plurality of nanowires and pads in the SOI layer with the pads attached at opposite ends of the nanowires in a ladder-like configuration;
forming a thermal oxide over the nanowires and pads;
forming a dummy gate on the thermal oxide surrounding at least a portion of each of the nanowires;
removing the thermal oxide from portions of the nanowires extending out from the gate and from at least a portion of each of the pads;
growing epitaxial germanium on the portions of the nanowires extending out from the gate and the portion of the pads from which the thermal oxide is removed;
interdiffusing the epitaxial germanium with silicon in the nanowires and pads to form embedded silicon germanium source and drain regions that introduce compressive strain in the nanowires;
depositing a dielectric film over the dummy gate and embedded silicon germanium source and drain regions;
removing the dummy gate to introduce additional strain in the nanowires; and
replacing the dummy gate with a replacement gate, wherein portions of the nanowires surrounded by the replacement gate serve as channels of the FET.

10. The method of claim 9, further comprising the step of:
forming spacers on opposite sides of the dummy gate.

11. The method of claim 9, wherein the dummy gate comprises poly-silicon.

12. The method of claim 9, wherein the epitaxial germanium is interdiffused with the silicon in the nanowires and pads using thermal mixing.

13. The method of claim 9, further comprising the step of:
further increasing a concentration of germanium in the silicon germanium regions using germanium condensation.

14. The method of claim 9, wherein the epitaxial germanium is grown on the portions of the nanowires extending out from under the gate and the portion of the pads at a temperature of about 300° C. in the presence of a germanium precursor.

15. The method of claim 14, wherein the germanium precursor comprises germane.

16. The method of claim 9, wherein the replacement gate comprises a metal gate material.

17. The method of claim 9, wherein removal of the dummy gate forms a trench in the dielectric film and exposes the thermal oxide over the nanowires, the method further comprising the step of:
replacing the thermal oxide over the nanowires with a gate dielectric.

18. The method of claim 9, wherein the replacement gate is a surrounding gate.

19. The method of claim 9, wherein the replacement gate is an omega gate.

20. The method of claim 9, further comprising the step of:
doping the embedded silicon germanium source and drain regions using one of in-situ doping and ion-implantation.

* * * * *